United States Patent [19]

Kolm et al.

[11] 4,333,029
[45] Jun. 1, 1982

[54] PIEZOELECTRIC SEISMIC SENSOR FOR INTRUSION DETECTION

[75] Inventors: Eric A. Kolm, Brookline; Henry H. Kolm, Wayland, both of Mass.

[73] Assignee: Baker Industries, Inc., Parsippany, N.J.

[21] Appl. No.: 72,537

[22] Filed: Sep. 4, 1979

[51] Int. Cl.³ .......................................... H01L 41/08
[52] U.S. Cl. .................................. 310/329; 310/332; 73/516 R
[58] Field of Search .............................. 310/329–332, 310/334, 336, 324, 322, 348, 328, 345, 354–356; 73/516 R, 517 R; 340/565, 566, 665, 666

[56] References Cited

U.S. PATENT DOCUMENTS

| | | | |
|---|---|---|---|
| 2,045,404 | 6/1936 | Nicholides | 310/329 X |
| 2,722,614 | 11/1955 | Fryklund | 310/329 |
| 2,728,869 | 12/1955 | Pohlman | 310/334 |
| 2,830,202 | 4/1958 | Feinstein | 310/329 |
| 3,113,223 | 12/1963 | Smith et al. | 310/331 X |
| 3,186,237 | 6/1965 | Forrest | 310/329 X |
| 3,486,047 | 12/1969 | Seney | 310/329 |
| 3,519,009 | 7/1970 | Rubin | 310/332 |
| 3,622,813 | 11/1971 | Kumon | 310/345 |
| 3,665,259 | 5/1972 | Brailsford | 310/329 |

FOREIGN PATENT DOCUMENTS 230524  3/1944  Switzerland .......................... 310/329

Primary Examiner—Mark O. Budd
Attorney, Agent, or Firm—James J. Jennings

[57] ABSTRACT

A seismic sensor for intrusion detection includes a base, a cantilever member of piezoelectric construction extending from the base, and a mass loading the end of the cantilever member remote from the base. The base defines a slot for receiving the end of the cantilever member, and holes, perpendicular to the slot, for receiving electrical conductors. These conductors are configured to orient the cantilever member at 45° relative to the horizontal, providing a sensitivity in both the X direction and the Y direction. A housing encloses the sensor, and another leg extends from the housing at the end remote from the base, enhancing the mechanical coupling between the sensor and the surface on which it is supported.

10 Claims, 5 Drawing Figures

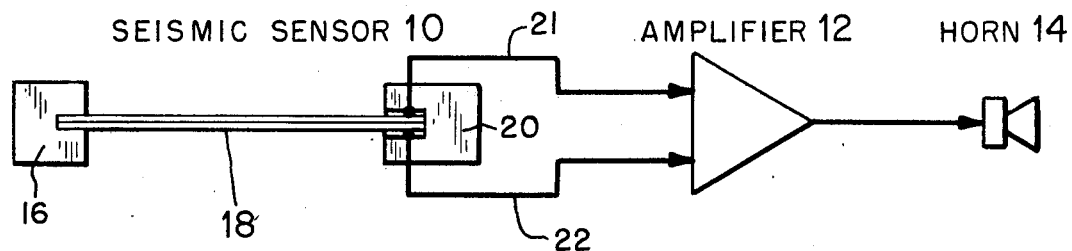
FIG. 1
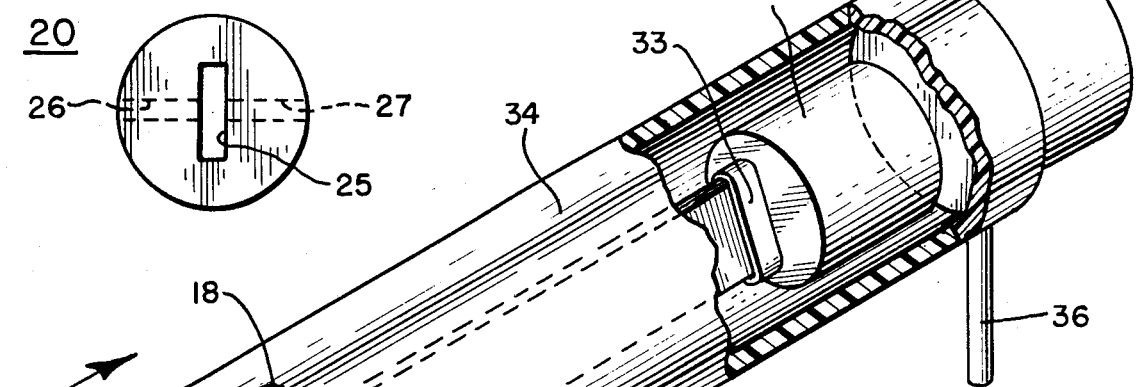
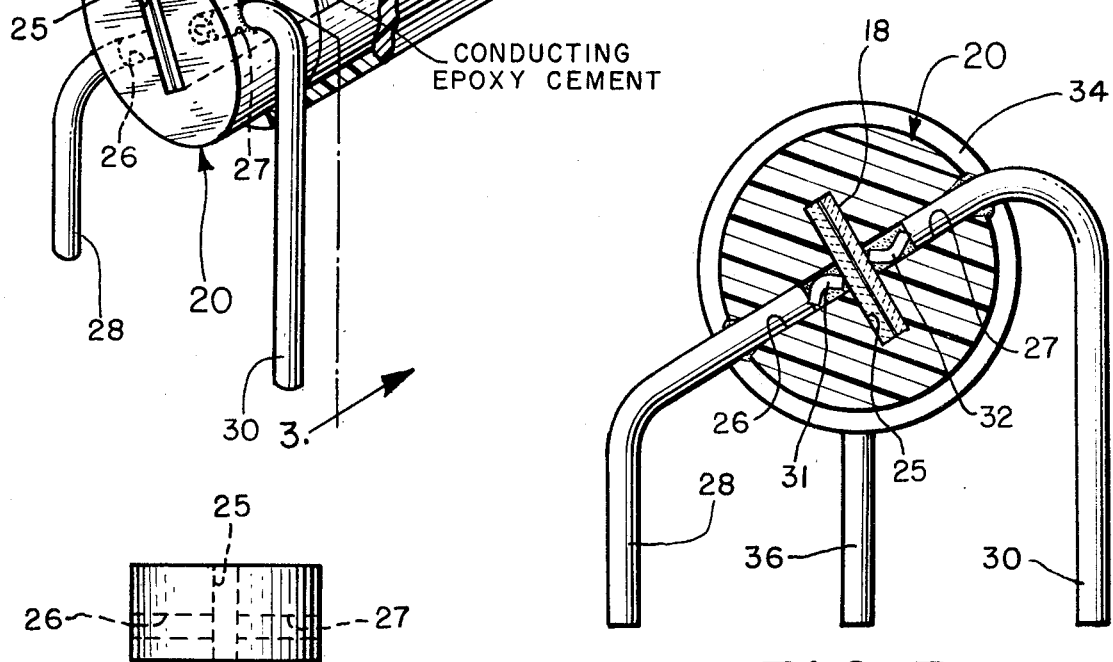

PIEZOELECTRIC SEISMIC SENSOR FOR INTRUSION DETECTION

BACKGROUND OF THE INVENTION

Piezoelectric transducers have been known and used for some time. Considerable work has been done in the last several decades, for example, for use in sonar systems. The use of such transducers for energization by electrical energy to produce a mechanical movement, as well as to receive mechanical input energy and produce a related electrical signal, is now well known. Such transducers have also been used in accelerometers, phonographs, cartridges, machine vibration sensors and/or counters, and related arrangements.

In the field of life and property protection, piezoelectric transducers have not been widely utilized as sensors or detectors. Instead vibration detectors such as spring-activated contact switches or mass loaded spring contacts have been employed. Other sensors, such as concentric free-floating masses which are relatively movable to function as a make-or-break switch, have also been employed, as well as coils moving in a magnetic field. However, for reasons of simplicity, economy, and reliability, as well as desired sensitivity over a certain frequency range, considerable work is still being directed to the improvement of such sensors for intrusion detectors.

It is, therefore, a principal object of the present invention to provide an improved sensor for intrusion detection systems, in which the sensitivity is significantly greater than has been attained with other mechanical devices.

Another important object of the invention is the provision of such an improved sensor which can protect an entire wall or wide area of an enclosure, responding to breakage of a window or to the opening of a door at a distance from the sensor itself.

Still another important object of the invention is to provide such a sensor which has a high sensitivity over a specific frequency range related to the type of intrusion against which protection is sought.

It is another important object of the invention to provide such an improved sensor which is highly responsive along two different axes of the usual three-axis coordinate system.

SUMMARY OF THE INVENTION

A seismic sensor assembly constructed in accordance with this invention is useful in an intrusion detection system. The sensor assembly includes a base member, and a cantilever member is affixed to, and extends substantially perpendicular from, the base member. This cantilever member includes a metal shim having upper and lower surfaces. A first piezoelectric ceramic element is affixed to the upper surface of the shim, and a second piezoelectric ceramic element is affixed to the shim's lower surface. A mass is attached to the cantilever member at the end remote from the base member. This mass moves when subjected to vibration to bend the cantilever member and produce an output voltage from the piezoelectric ceramic elements which is a function of the mass displacement.

THE DRAWING

In the several figures of the drawing, like reference numerals identify like components, and in that drawing:

FIG. 1 is a schematic diagram of an intrusion detection system of the type in which the present invention is useful;

FIG. 2 is a perspective illustration of a preferred embodiment of the seismic sensor of this invention;

FIG. 3 is a cross-section showing, taken along line 3—3 of FIG. 2, useful in understanding the construction of the present invention; and FIGS. 4 and 5 are front and side views, respectively, of the base member used in connection with a preferred embodiment of the invention.

DETAILED DESCRIPTION OF THE PREFERRED EMBODIMENT

FIG. 1 shows a general intrusion detection system comprising a seismic sensor 10, an amplifier 12 and a horn 14. Sensor 10 includes a base member 16, and a cantilever member 18 of conventional piezoelectric construction, extending substantially perpendicular to base member 16. A mass 20 is attached to the cantilever member at the end remote from base member 16. This arrangement provides a mass-loaded piezoelectric cantilever type sensor extremely sensitive and accurate in producing output electrical signals in response to vibration of the cantilever member 18. This signal is transferred over conductors 21, 22 from the sensor, amplified in stage 12, and translated into mechanical energy in horn 14 or any other suitable alarm unit. The specific arrangement for amplifying the electrical signal and converting this signal into mechanical energy, or otherwise using the energy to indicate an alarm condition, is not essential to the sensing arrangement of this invention. Thus a more extensive description of the amplifier and the alarm arrangement will not be set out.

As shown in FIG. 2, the cantilever member includes a piezoelectric "bilam" or bilaminate member 18. Such piezoelectric members are now commercially available and need not be described in detail. The cantilever member 18 is actually a composite flexure member of a "sandwich" type construction. In the center is a metal shim, which in a preferred embodiment was 0.002 inch thick, 0.060 inch wide, and 1.00 inch long. On each side of the shim is a piezoelectric ceramic piece of lead titanate-lead zirconate composition, or any other suitable piezoelectric ceramic. Each of the ceramic elements was 0.009 inch thick, 0.020 inch wide, and 1.00 inch in length. Thus the resultant cantilever arm was approximately 0.021 inch thick, with the same width and length dimensions as the individual shim and both ceramic pieces. It has been found that such a piezoelectric bilam functions very efficiently to produce an electrical signal in response to vibration of the type desired to sense in an intrusion detection system.

As shown in FIGS. 3, 4 and 5, base member 20 is generally cylindrical, and defines a slot 25 for receiving the end of the cantilever or bilam member. In addition, the base member defines a pair of opposed holes 26, 27 for receiving a pair of electrical conductors 28, 30 when the sensor is assembled. In particular, each of the holes 26, 27 is drilled in the base to have a diameter equal to the diameter of each wire lead 28, 30, to effect a good electrical contact with the end of member 18 inserted into the slot 25. The base member is made of a plastic disc or cylinder of Lexan or a similar plastic. A suitable electrically conductive epoxy is injected into each of the holes 26, 27 before the conductors 28, 30 are inserted.

To improve the electrical connections to the bilam even more, a pair of short spring wire leads 31, 32 are utilized, in a manner best shown in FIG. 2. In a preferred embodiment, the holes 26, 27 were each 0.032 inch in diameter, and the short wires 31, 32 were of only 0.005 inch diameter, and of phosphor-bronze. In the assembly sequence, electrically conductive epoxy is first injected into the holes 26, 27, the short spring wires are then dropped into the holes, and the lead wires 28, 30, are pressed into the respective slots 26, 27. The spring wires 31, 32 are deformed as shown, and thus provide very good contact between conductors 28, 30 and the surfaces of bilam 18 received in slot 25. The conductors are held in the position illustrated in FIG. 2 by a suitable fixture (not shown) until the epoxy sets up. Thus there is a very good electrical contact between each of the conductors 28, 30 and one surface of the bilam, even if a wire lead (28 or 30) does not make physical contact with the bilam.

In a preferred embodiment, slot 25 was formed to be 0.021 inch in height and 0.061 inch in width, providing a very good fit for the cantilever member when it is inserted into the slot. Mass 16 is attached to the end of cantilever arm 18 at the end remote from base member 20. In a preferred embodiment this mass was provided by a lead weight of 1.5 grams, 0.30 inch in length and 0.23 inch in diameter. An insulating sleeve 33, of shrink tubing or some similar plastic material, is provided between the mass and the bilam to prevent the conductive mass member from electrically shorting the bilam. A protective housing or sleeve 34 is then inserted over mass 16, cantilever 18 and a portion of base member 20. This solid tube or cylinder 34 in a preferred embodiment was 1.344 inch in length, with an outer diameter of 0.375 inch and an inner diameter of 0.280 inch. These dimensions provide sufficient clearance so that the bilam 18 can move sufficiently to provide a good electrical signal on conductors 28, 30 when vibration is sensed, while still restricting movement to the extent that bilam breakage is prevented if the entire unit is dropped. An end cap 35 is then inserted into the end of housing 34 as shown. A perpendicular support leg 36 can be attached either to the housing or the end plug for additional mechanical support to an adjacent surface, such as a circuit board, the same board to which the conductors 28, 30 are to be electrically and mechanically attached. The support leg 36 enhances the mechanical coupling between the sensor and the surface of which the vibrations are to be sensed. The completed assembly is then dipped into a coating epoxy material, providing both physical protection and effective sealing against degreasing liquids and vapors.

Technical Advantages

The seismic sensor described above has proved extremely sensitive to vibrations developed as a result of breaking glass, movement of a window or door, or other vibrations which exceed a predetermined magnitude. It has been found that placement of one sensor in a large room can detect the opening of a door or glass breakage at a considerable distance from the sensor. So, by selecting the dimensions of the cantilever member and the mass, the seismic sensor can be "tuned" to have a high sensitivity over a specific frequency range, related to the frequencies in the spectrum produced upon a particular type of intrusion.

The particular construction of the seismic sensor illustrated above and claimed herein offers additional advantages. By configuring the electrical conductors which provide both the electrical connections and the mechanical support to an adjacent surface, the cantilever member can be oriented at 45°. This provides good sensitivity in both the X direction, or parallel to the plane of the surface on which the sensor is to be supported, and in the Y direction, in a plane perpendicular to that surface. Use of the small spring wires between the electric conductors and the bilam surfaces ensures good electrical contact, even though there may be some minute displacement of the conductors as the epoxy cement sets up. The protective sleeve or housing both prevents the entry of matter, and limits the amplitude of vibration of the cantilever member. It has been found that a more than adequate electrical signal is developed in the degree of movement afforded by the housing, and no additional flexure is required.

What is claimed is:

1. A seismic sensor assembly for use in an intrusion detection system, comprising:
   a base member;
   a cantilever member, comprising a composite flexure member affixed to, and extending substantially perpendicular from, the base member, which flexure member includes a metal shim having upper and lower surfaces, a first piezoelectric ceramic element affixed to the shim upper surface, and a second piezoelectric ceramic element affixed to the shim lower surface, in which said base member defines a slot for receiving the cantilever member, and said base member further defines a pair of opposed holes extending from the surface of the base member to the slot;
   a mass, attached to the cantilever member at the end remote from the base member to provide a mass-loaded, piezoelectric cantilever member, for movement when subjected to vibration to bend the cantilever member and produce an output voltage from the piezoelectric ceramic elements which is a function of the mass displacement;
   a pair of electrical conductors, each of which extends through one of said holes; and
   a pair of wire leads, one of which is inserted in each of said holes prior to insertion of the electrical conductor, to enhance the electrical conductivity between the electrical conductor and the surface of the cantilever member received in the slot.

2. A seismic sensor assembly as claimed in claim 1, in which the cantilever member is aligned at an angle of 45° with respect to a reference horizontal plane, thus providing sensitivity in both the X direction in the horizontal plane and in the Y direction in a plane perpendicular to the horizontal reference plane.

3. A seismic sensor assembly as claimed in claim 1, and further comprising a housing virtually enclosing said cantilever member, which housing is dimensioned to permit adequate motion of the cantilever member and simultaneously limit the extension of such motion, to prevent breakage of the cantilever member.

4. A seismic sensor assembly as claimed in claim 3, and further comprising a leg support affixed to said housing at the end remote from the base member, thus enhancing mechanical coupling between the seismic sensor and an adjacent surface.

5. A seismic sensor assembly for use in an intrusion detection system, comprising:
   a base member having a reference surface;

a cantilever member, comprising a composite flexure member affixed to, and extending substantially perpendicular from, the base member, which flexure member includes a metal shim having upper and lower surfaces, a first piezoelectric ceramic element affixed to the shim upper surface, and a second piezoelectric ceramic element affixed to the shim lower surface, said base member defining a slot for receiving the cantilever member, and said base member further defining a pair of opposed holes extending from the surface of the base member to the slot;

a mass, attached to the cantilever member at the end remote from the base member to provide a mass-loaded piezoelectric cantilever member, for movement when subjected to vibration to bend the cantilever member and produce an output voltage from the piezoelectric ceramic elements which is a function of the mass displacement;

a pair of electrical conductors, each of which extends through one of said holes; and a pair of spring wire leads, one of which is inserted in each of said holes prior to insertion of the electrical conductor, to be deformed as the electrical conductor pushes the spring wire against the cantilever member surface and thus enhance the electrical conductivity between the electrical conductor and the surface of the cantilever member received in the slot.

6. A seismic sensor assembly as claimed in claim 5, in which the pair of electrical conductors also provide mechanical support for contacting an adjacent surface, such as a circuit board, and said electrical conductors are configured to align the cantilever member at an angle of 45° with respect to a reference horizontal plane, thus providing sensitivity in both the X direction in the horizontal plane and in the Y direction in a plane perpendicular to the horizontal reference plane.

7. A seismic sensor assembly as claimed in claim 5, and further comprising a cylindrical housing virtually enclosing said cantilever member, which housing is dimensioned to permit adequate motion of the cantilever member and still limit the extention of such motion, to prevent breakage of the cantilever member.

8. A seismic sensor assembly as claimed in claim 7, and further comprising a leg support affixed to said housing at the end remote from the base member, thus enhancing mechanical coupling between the seismic sensor and the adjacent surface.

9. A seismic sensor assembly as claimed in claim 7, and further comprising an end plug closing the end of the housing remote from the base member.

10. A seismic sensor assembly for use in an intrusion detection system, comprising:

a base member having a reference surface;

a cantilever member, comprising a composite flexure member affixed to, and extending substantially perpendicular from, the base member, said composite flexure member measuring substantially 1.0 inch in length, 0.061 inch in width, and 0.021 inch in height, which flexure member includes a metal shim having upper and lower surfaces, a first piezoelectric ceramic element affixed to the shim upper surface, and a second piezoelectric ceramic element affixed to the shim lower surface, said base member defining a slot for receiving the cantilever member, and said base member further defining a pair of opposed holes extending from the surface of the base member to the slot;

a mass, attached to the cantilever member at the end remote from the base member to provide a mass-loaded, piezoelectric cantilever member, for movement when subjected to vibration to bend the cantilever member and produce an output voltage from the piezoelectric ceramic elements which is a function of the mass displacement; and a pair of electrical conductors, each of which extends through one of said holes to contact the portion of the cantilever member received in said slot.

* * * * *